(12) United States Patent
Choi

(10) Patent No.: US 12,300,672 B2
(45) Date of Patent: May 13, 2025

(54) DISPLAY DEVICE USING MICRO LED AND MANUFACTURING METHOD THEREFOR

(71) Applicant: LG ELECTRONICS INC., Seoul (KR)

(72) Inventor: Bongseok Choi, Seoul (KR)

(73) Assignee: LG ELECTRONICS INC., Seoul (KR)

(*) Notice: Subject to any disclaimer, the term of this patent is extended or adjusted under 35 U.S.C. 154(b) by 640 days.

(21) Appl. No.: 17/616,553

(22) PCT Filed: Jun. 12, 2019

(86) PCT No.: PCT/KR2019/007092
§ 371 (c)(1),
(2) Date: Dec. 3, 2021

(87) PCT Pub. No.: WO2020/251076
PCT Pub. Date: Dec. 17, 2020

(65) Prior Publication Data
US 2022/0230997 A1 Jul. 21, 2022

(30) Foreign Application Priority Data

Jun. 12, 2019 (KR) .......................... 10-2019-0069269

(51) Int. Cl.
*H01L 25/00* (2006.01)
*H01L 25/075* (2006.01)
(Continued)

(52) U.S. Cl.
CPC ......... *H01L 25/0753* (2013.01); *H10H 20/01* (2025.01); *H10H 20/857* (2025.01); *H10H 20/0364* (2025.01)

(58) Field of Classification Search
None
See application file for complete search history.

(56) References Cited

U.S. PATENT DOCUMENTS

2001/0031514 A1  10/2001  Smith
2002/0005284 A1  1/2002  Mayer et al.
(Continued)

FOREIGN PATENT DOCUMENTS

KR    10-1211717 B1    12/2012
KR    10-2017-0117282 A    10/2017
KR    10-2019-0057640 A    5/2019

OTHER PUBLICATIONS

Korean Notice of Allowance for Korean Application No. 10-2019-0069269, dated Sep. 23, 2024, with English translation.

*Primary Examiner* — Bradley Smith
(74) *Attorney, Agent, or Firm* — Birch, Stewart, Kolasch & Birch, LLP

(57) ABSTRACT

A method for manufacturing a display device can include growing a plurality of light emitting (LEDs) on a growing substrate; forming a member having a thermal flow characteristic on at least one side surface of each of the plurality of LEDs; separating each of the plurality of LEDs from the growing substrate; forming a plurality of assembly grooves in a wiring substrate for defining pixel regions; assembling the plurality of LEDs at locations respectively corresponding to the plurality of assembly grooves; and applying heat to the wiring substrate to perform a reflow process for adjusting a position of at least one of the plurality of LEDs.

17 Claims, 24 Drawing Sheets

(51) Int. Cl.
    *H10H 20/01*      (2025.01)
    *H10H 20/857*    (2025.01)

(56) References Cited

U.S. PATENT DOCUMENTS

| | | | |
|---|---|---|---|
| 2010/0059787 A1* | 3/2010 | Hoshina | H01L 33/54 |
| | | | 257/E33.059 |
| 2012/0320581 A1* | 12/2012 | Rogers | F21V 29/70 |
| | | | 257/E33.059 |
| 2013/0187179 A1* | 7/2013 | Tan | H01L 33/54 |
| | | | 438/26 |
| 2014/0367633 A1* | 12/2014 | Bibl | H01L 33/56 |
| | | | 257/13 |
| 2015/0228631 A1* | 8/2015 | Ray | H01L 33/56 |
| | | | 438/29 |
| 2017/0236811 A1* | 8/2017 | Pokhriyal | H01L 33/005 |
| | | | 257/91 |
| 2018/0190614 A1* | 7/2018 | Kumar | H01L 24/16 |
| 2019/0091722 A1* | 3/2019 | Greenley | C08G 59/18 |
| 2020/0321234 A1* | 10/2020 | Choi | H01L 25/50 |

* cited by examiner (a)

(b)

(a) (b)

DISPLAY DEVICE USING MICRO LED AND MANUFACTURING METHOD THEREFOR

CROSS REFERENCE TO RELATED APPLICATIONS

This application is the National Phase of PCT International Application No. PCT/KR2019/007092, filed on Jun. 12, 2019, which claims priority under 35 U.S.C. § 119 (a) to Patent Application No. 10-2019-0069269, filed in the Republic of Korea on Jun. 12, 2019, all of these applications being hereby expressly incorporated by reference into the present application.

BACKGROUND

Technical Field

The present disclosure is applicable to a display device-related technical field, and relates, for example, to a display device using a micro light emitting diode (LED) and a method for manufacturing the same.

Background Art

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time is not fast and it is difficult for the LCD to be flexibly implemented. In addition, the OLED has a short lifespan and has a mass production yield that is not good.

In one example, an LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

A size of such semiconductor light emitting element has recently been reduced to tens of micrometers. Therefore, when implementing the display device using the semiconductor light emitting elements, a very large number of semiconductor light emitting elements must be assembled on a wiring substrate of the display device.

However, during the assembly process, there is a problem in that it is very difficult to precisely position a number of semiconductor light emitting devices at desired positions on the wiring substrate.

SUMMARY

Technical Problem

A technical task to be solved by the present disclosure is to provide a display device capable of precise positioning when assembling a semiconductor light emitting element on a substrate and a method for manufacturing the same.

Specifically, the present disclosure is to provide a display device in which a semiconductor light emitting element is assembled on a substrate and then self-aligned to an exact position on the substrate through a reflow process, and a method for manufacturing the same.

Technical Solutions

A method for manufacturing a display device for achieving the above purpose includes growing a plurality of LEDs on a growing substrate, forming a member having a thermal flow characteristic on at least one side surface of each of the plurality of LEDs, separating each of the plurality of LEDs having the member formed thereon from the growing substrate, preparing a wiring substrate having a plurality of assembly grooves defined therein for defining pixel regions, assembling each separated LED into each assembly groove of the wiring substrate, and performing reflow by heat on the wiring substrate having the LED assembled thereon.

As an embodiment, the preparing of the wiring substrate includes applying an adhesive layer to the assembly groove and a periphery of the assembly groove.

As an embodiment, a component of the adhesive layer includes a component having the thermal flow characteristic.

As an embodiment, a component of the adhesive layer is the same as a component of the member.

As an embodiment, a component of the adhesive layer includes at least one of epoxy, acryl, silicone, polyimide (PI), and benzocyclobutene (BCB).

As an embodiment, the adhesive layer contains a binder and a monomer component allowing a material having no thermal flow characteristic to have the thermal flow characteristic.

As an embodiment, the assembly groove has an opening and a bottom surface, wherein an area of the opening is greater than an area of the bottom surface.

As an embodiment, the forming of the member includes curing the member by ultra-violet (UV) curing or thermal curing.

As an embodiment, the preparing of the wiring substrate includes disposing a metal reflective film at a lower portion of the assembly groove.

As an embodiment, the assembling of each LED into each assembly groove includes allowing the LED to be self-assembled into the assembly groove by an electromagnetic field.

As an embodiment, the assembling of each LED into each assembly groove includes transferring the LED to a transfer substrate, and assembling the LED transferred to the transfer substrate into the assembly groove of the wiring substrate through a stamp process.

As an embodiment, the LED is an LED (micro-LED) having a micrometer size.

As an embodiment, the substrate contains at least one of glass, a conductor, and a flexible polymer material.

A display device according to an embodiment of the present disclosure includes a substrate having an assembly groove defined therein, an adhesive layer for covering the assembly groove and a periphery of the assembly groove, and an LED assembled into the assembly groove having the adhesive layer formed thereon, the LED has a member having a thermal flow characteristic on at least one side surface thereof, the assembly groove has an opening and a bottom surface, and an area of the opening is greater than an area of the bottom surface.

Advantageous Effects

According to an embodiment of the present disclosure, the adhesive layer having the thermal flow characteristic is applied to the assembly groove in which the semiconductor light emitting element is assembled. Thereafter, the semiconductor light emitting element is assembled on the substrate and is self-aligned at the precise position of the assembly groove through the reflow process, thereby increasing the positional accuracy.

According to another embodiment of the present disclosure, the semiconductor light emitting element may be assembled on the substrate, and the arrangement error of the chip may be minimized in the subsequent planarization process and electrode formation process, thereby increasing the production yield and reducing the manufacturing cost without requiring a separate wiring design.

Furthermore, according to another embodiment of the present disclosure, there are additional technical effects not mentioned herein. Those of ordinary skill in the art may understand it through the full text of the specification and drawings.

DETAILED DESCRIPTION OF THE EMBODIMENTS

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
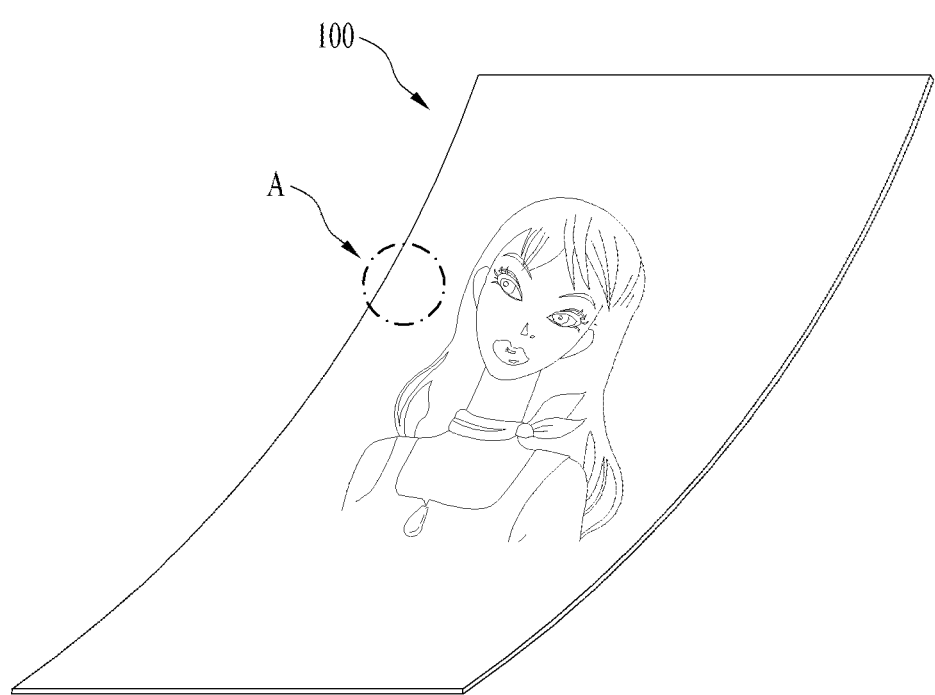
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
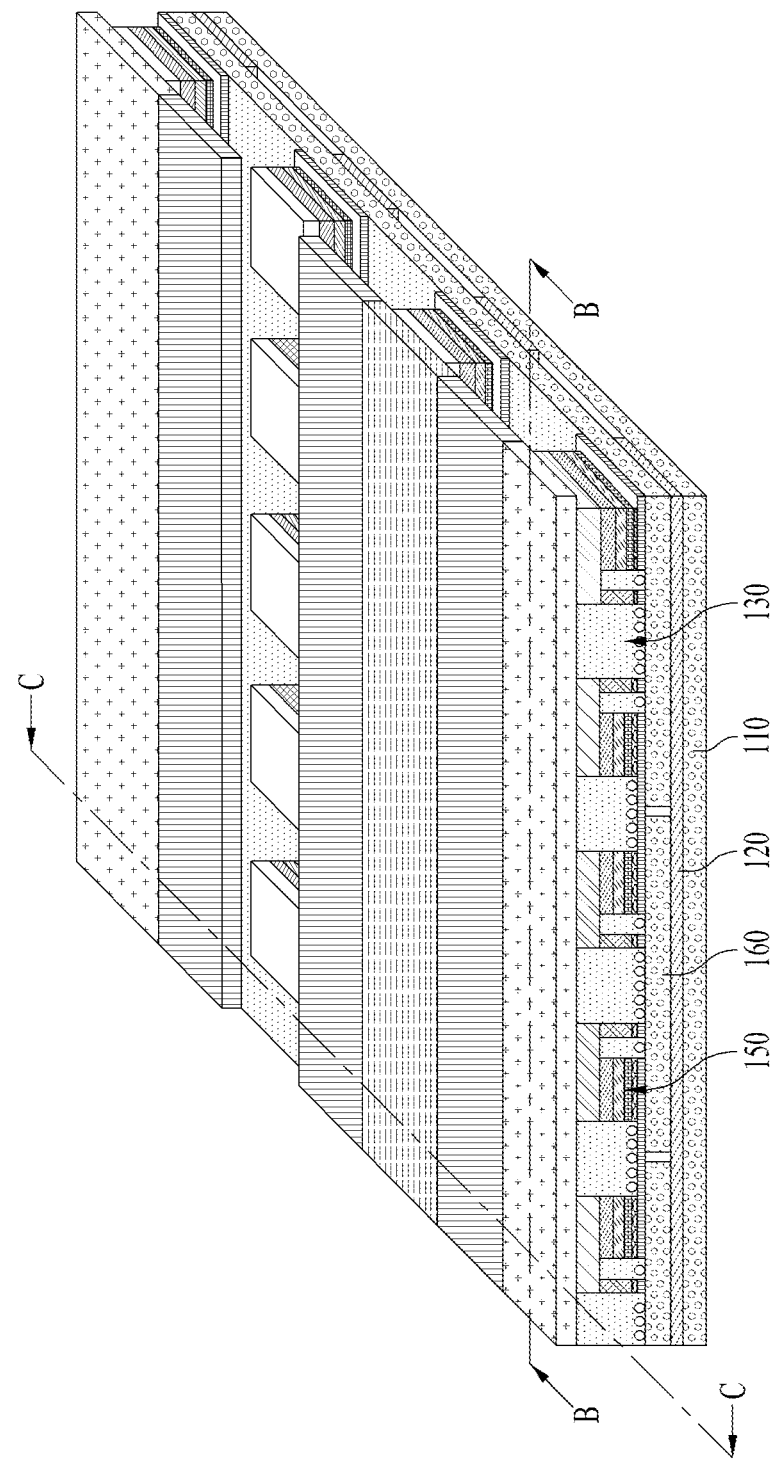
FIG. 2 is a partially enlarged diagram showing a part A shown in FIG. 1.

FIG. 2 is a partially enlarged view showing part A of FIG. 1.

Figure 3A:
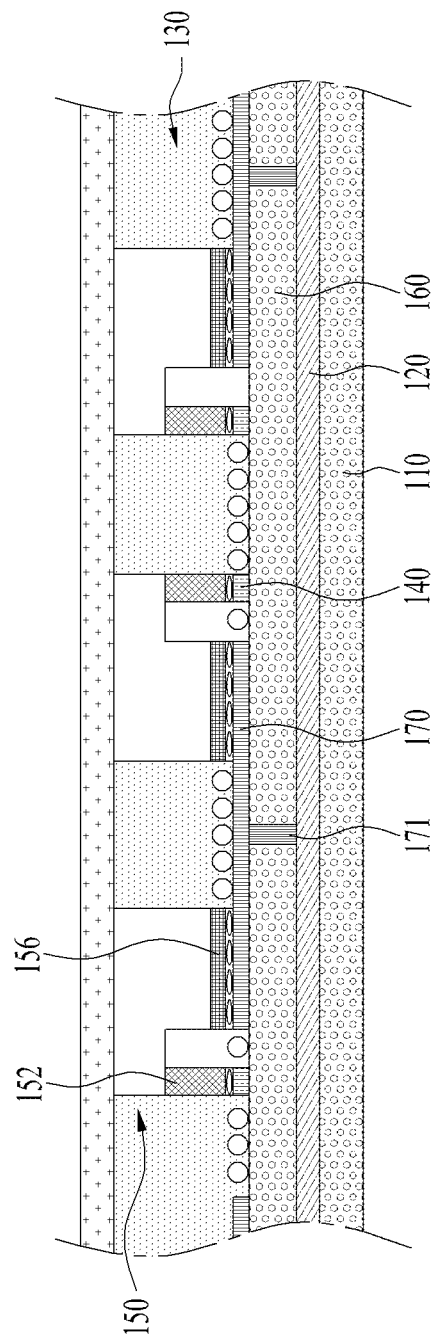
FIGS. 3A and 3B are cross-sectional diagrams taken along the cutting lines B-B and C-C in FIG. 2.
Figure 3B:
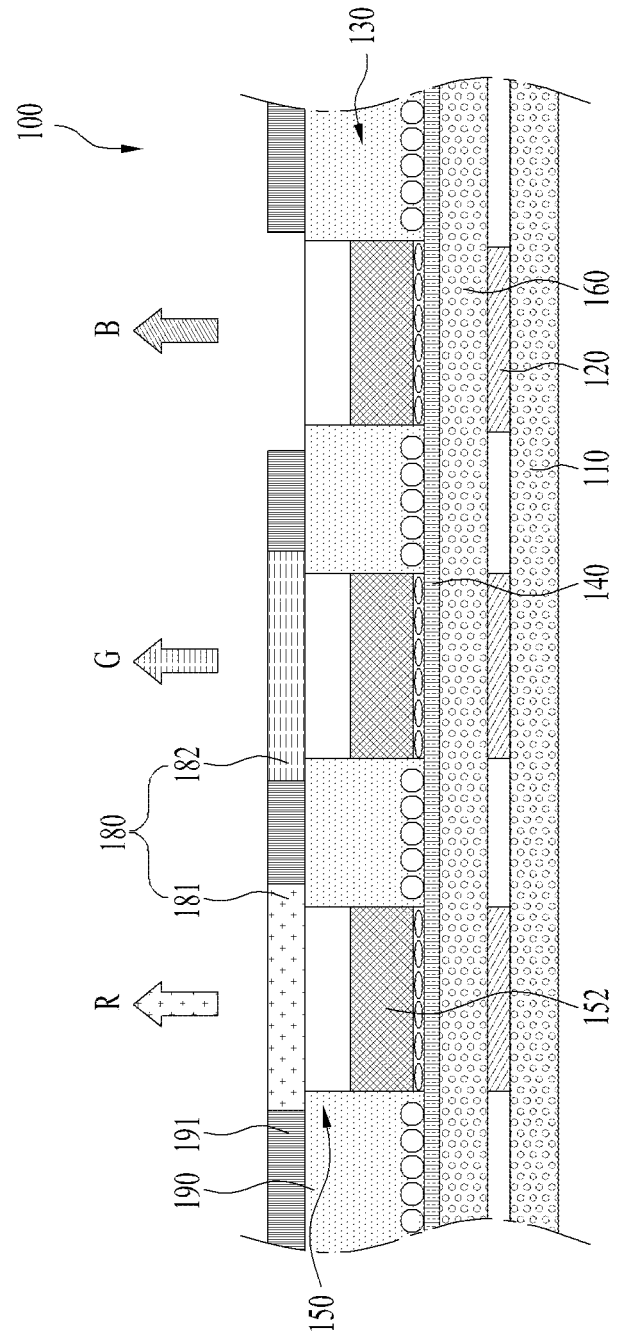

FIGS. 3A and 3B are cross-sectional views taken along lines B-B and C-C in FIG. 2.

Figure 4:
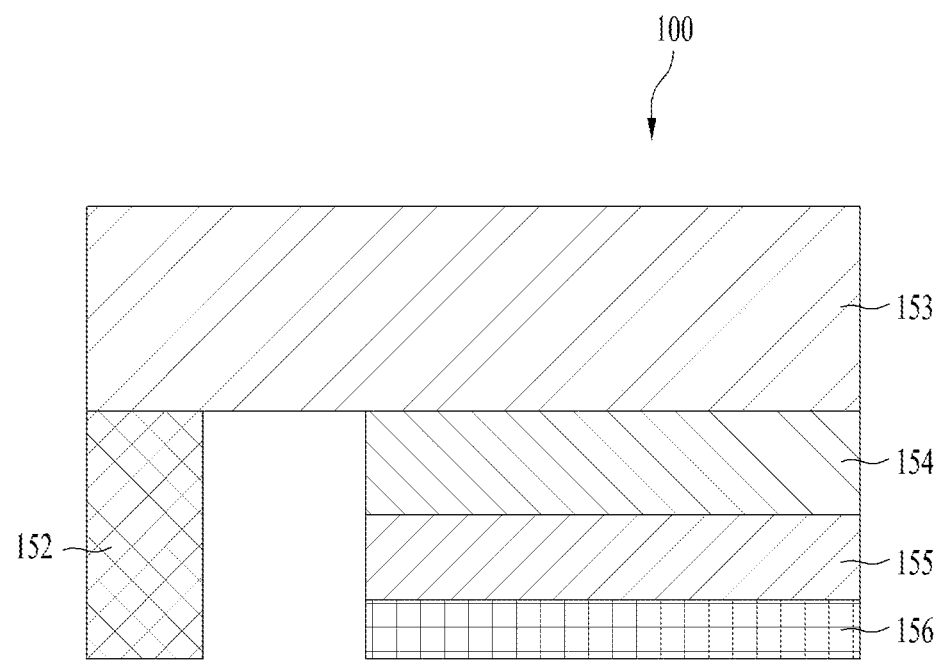
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
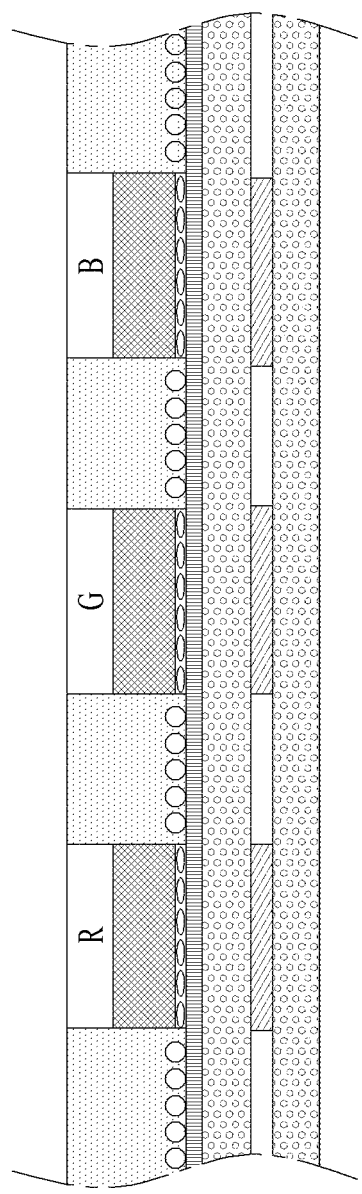
FIGS. 5A to 5C are conceptual diagrams illustrating various examples of color implementation with respect to a flip-chip type semiconductor light emitting element.
Figure 5B:
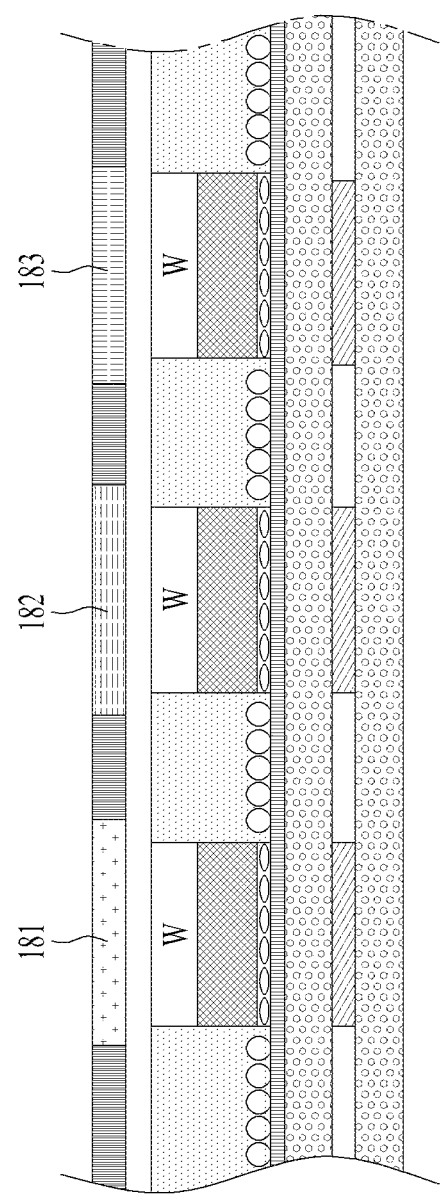
Figure 5C:
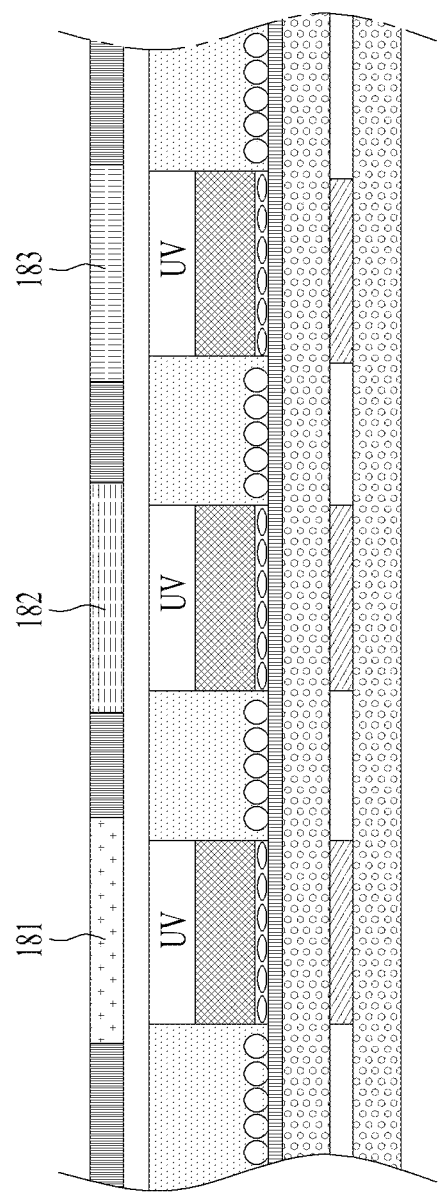

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip-chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
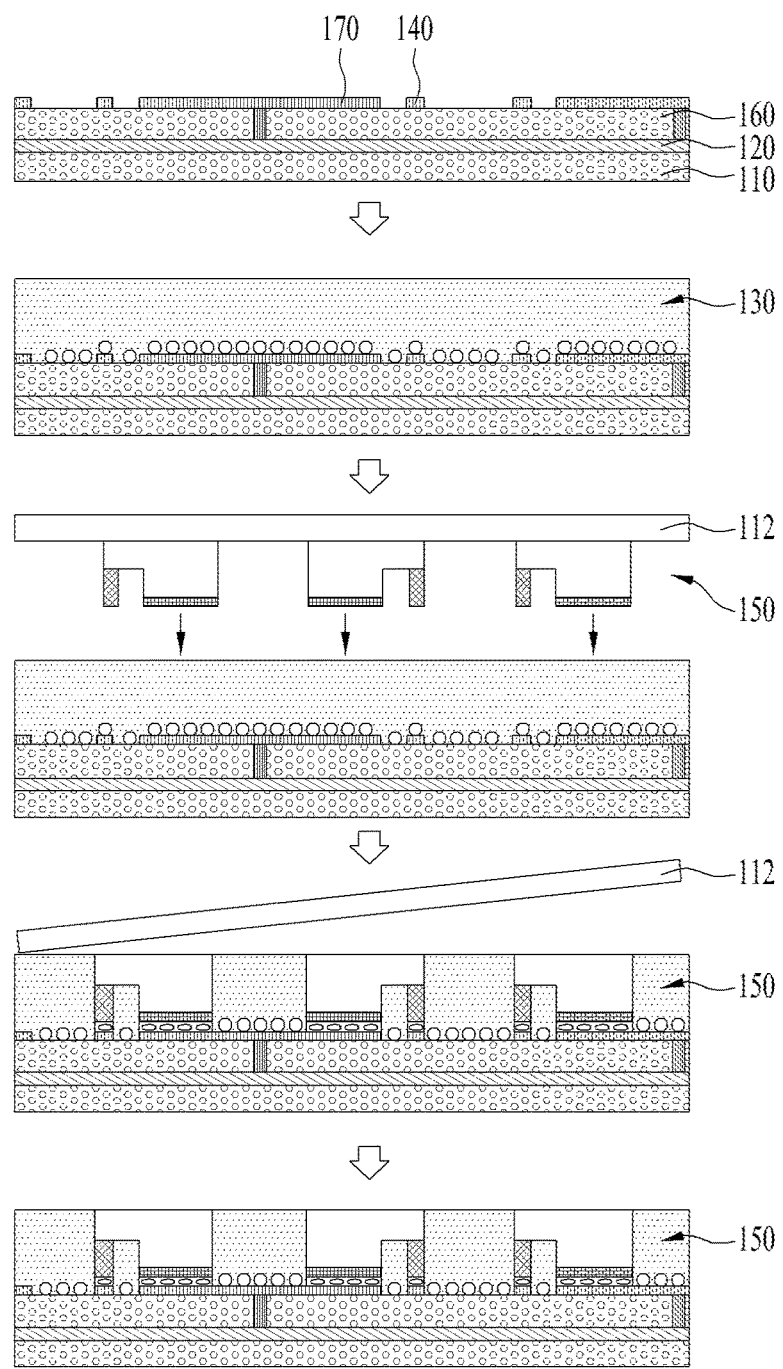
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicone substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicone oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
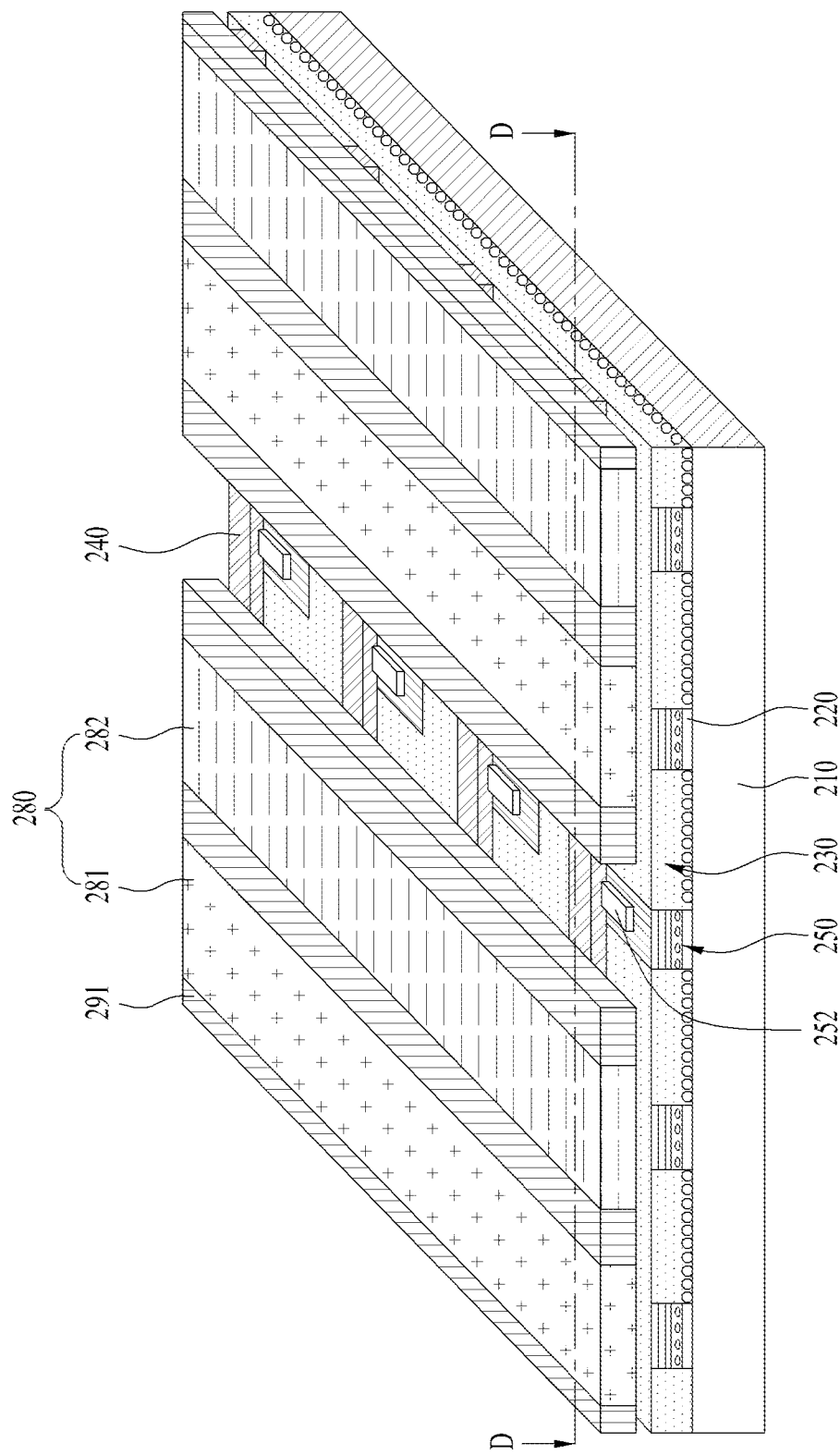
FIG. 7 is a perspective diagram of a display device using a semiconductor light emitting element according to another embodiment of the present disclosure.
Figure 8:
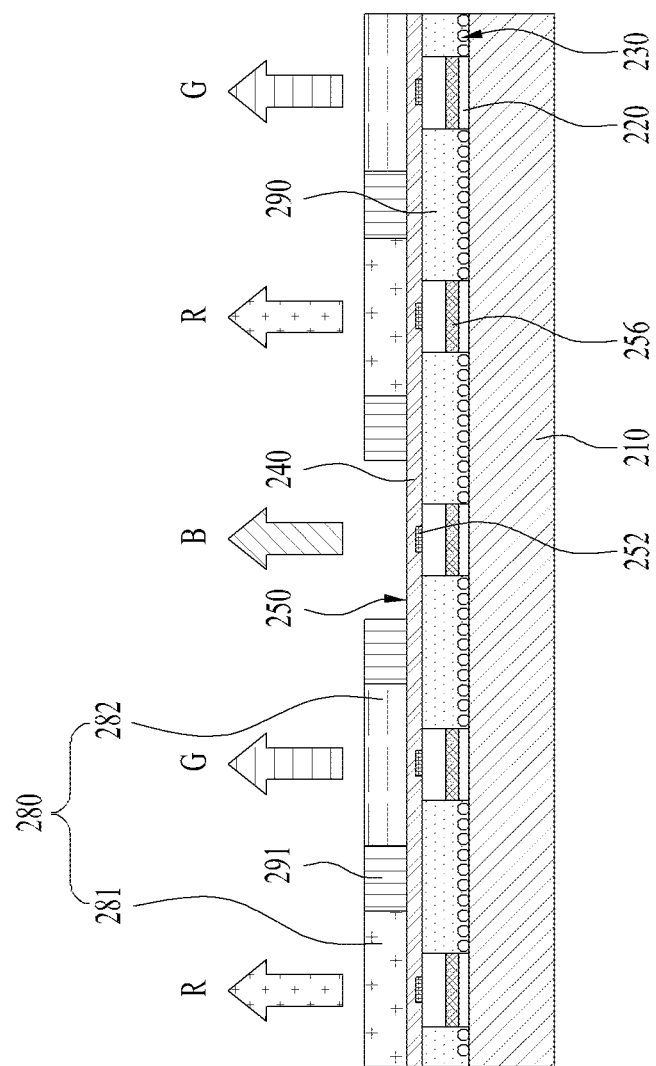
FIG. 8 is a cross-sectional diagram taken along a cutting line D-D shown in FIG. 8.
Figure 9:
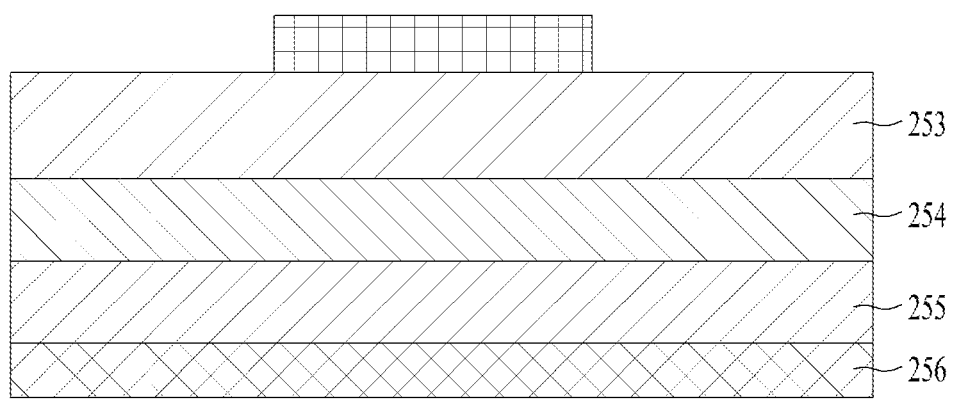
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 220 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip-chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip-chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicone oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light emitting element of the present disclosure described above, the semiconductor light emitting element is disposed on the wiring substrate in the flip-chip form that is and used as the individual pixel.

Accordingly, in the process in which the semiconductor light emitting element is disposed on the substrate, there is an arrangement error. Considering the size of the current semiconductor light emitting element for the display, the arrangement error should be managed to be in a range from ±5 to 10 µm in a development stage and to be at a level of ±3 µm level in a mass production management stage, which is the most important key factor in a panel process yield.

Realistically, managing the arrangement error is a factor that increases a manufacturing cost as separate management equipment and time are added. Another embodiment of the present disclosure for solving such a problem will be described later in detail with reference to FIGS. 10 to 20.

Figure 10:
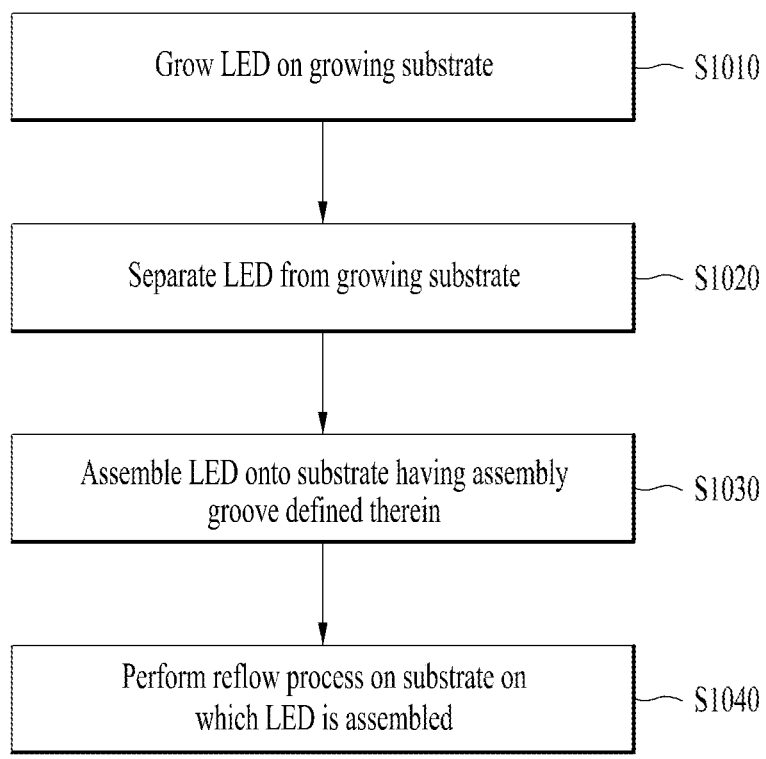
FIG. 10 is a flowchart illustrating a method for manufacturing a display device using a semiconductor light emitting element according to another embodiment of the present disclosure.

FIG. 10 is a flowchart illustrating a method for manufacturing a display device using a semiconductor light emitting element according to another embodiment of the present disclosure.

First, the LED (or the semiconductor light emitting element) is grown on the growing substrate (S1010). In the present disclosure, the semiconductor light emitting element may be both a horizontal type semiconductor light emitting element and a vertical type semiconductor light emitting element. However, hereinafter, the horizontal type semiconductor light emitting element will be described as growing. Hereinafter, a detailed growth method will be described later with reference to FIGS. 11 and 12.

The LED (or the semiconductor light emitting element) grown on the growing substrate is separated from the growing substrate (S1020).

There are, for example, two main methods for separating the semiconductor light emitting element from the growing substrate. The first is that the semiconductor light emitting element of the growing substrate is directly transferred to a new substrate to be separated. Because this case is substrate-to-substrate transfer, a distance between the semiconductor light emitting elements after the transfer is maintained the same as that of the existing growing substrate. The second is that the semiconductor light emitting element is individually separated from the growing substrate and exists the individual semiconductor light emitting element.

In the case of the first method, the substrate to which the semiconductor light emitting element is transferred may be a donor substrate for another transfer, or a wiring substrate equipped with wiring to be utilized directly as a panel.

As described above, the transfer process involves transferring the semiconductor light emitting element of the growing substrate to the new substrate as if stamping a seal using an adhesive film or the like. Such process is referred, for example, to as a stamp process.

During the transfer process, the anisotropic conductive film may be used as the adhesive film to achieve conductivity between the substrate and the semiconductor light emitting element.

In order to selectively transfer only some of the semiconductor light emitting elements grown on the growing substrate, a method such as laser lift-off (LLO) that selectively separates the element by applying a laser to a surface of the substrate opposite to a surface on which the element is grown may be used.

In the second method, for example, the semiconductor light emitting element is separated to be the individual semiconductor light emitting element to perform a self-assembly process.

The self-assembly process refers to a process in which a very large number of semiconductor light emitting elements are assembled on an assembly substrate by a force of an electromagnetic field in a chamber filled with a fluid.

In order to be self-assembled, for example, the assembly substrate needs to have an assembly groove defined therein corresponding to the individual semiconductor light emitting element, and needs to have an assembly electrode at a lower portion of the assembly groove. The assembly substrate may be located in the chamber filled with the fluid.

The semiconductor light emitting element floating in the fluid includes, for example, a magnetic layer, so that the semiconductor light emitting element may move in a direction of the assembly substrate by an assembly apparatus having a magnetic body acting above the assembly substrate. That is, the semiconductor light emitting element in the chamber may move toward the assembly apparatus by a magnetic field generated by the assembly apparatus.

The assembly substrate with the assembly groove defined therein may be located in the direction of moving toward the assembly apparatus, and the semiconductor light emitting element may be in contact with the assembly groove.

In this case, the semiconductor light emitting element in contact with the assembly groove is fixed by an electric field applied from the assembly electrode formed at the lower portion of the assembly groove.

Using the self-assembly scheme using the electric and magnetic fields, a time required for assembling the semiconductor light emitting elements on the substrate may be drastically reduced.

As described above, the semiconductor light emitting element of the growing substrate may be separated and transferred to the new substrate at the same time through the stamp process, and may be separated as the individual element and assembled on the new substrate through the self-assembly process.

In addition, the LED (or the semiconductor light emitting element) of the new substrate is assembled on the wiring substrate for forming the panel (S1030).

The wiring substrate has the assembly groove defined therein for assembling the semiconductor light emitting element, and an adhesive layer having a thermal flow characteristic is applied on top of the assembly groove. Therefore, for example, when the adhesive layer is applied to the substrate used in the separating of the LED from the growing substrate (S1020), the semiconductor light emitting element may be separated from the growing substrate and assembled on the wiring substrate at the same time.

The thermal flow characteristic is a characteristic of the adhesive layer having a fluidity like a flow of the fluid when heat is applied to the adhesive layer. Accordingly, when the heat is applied after forming the adhesive layer at an inclined place, at least a portion of the adhesive layer may flow downward.

A component of the adhesive layer may be a polymer-based component, and includes, for example, at least one of epoxy, acryl, silicone, polyimide (PI), and benzocyclobutene (BCB).

In addition, the component of the adhesive layer may contain, for example, a binder and a monomer component allowing a material having no thermal flow characteristic to have the thermal flow characteristic.

In addition, viscosity of the adhesive layer may be variously adjusted to be in a range from several centi-poises (cps) to several hundreds of cps. Although the thermal flow characteristic varies depending on the viscosity, an effect of the viscosity may be attenuated by adjusting a temperature and a time in the reflow process. Therefore, in the present disclosure, it is important whether the component of the adhesive layer has the thermal flow characteristic. The present disclosure is not limited to the adhesive layer with the viscosity in a specific range, but it is also within another scope of the present disclosure to limit the range of the viscosity of the adhesive layer as necessary.

The semiconductor light emitting element is assembled into the assembly groove on which the adhesive layer is formed. When the semiconductor light emitting element is assembled from the donor substrate to the wiring substrate, an alignment operation is performed first.

The alignment operation is performed, for example, by horizontally moving one of the donor substrate and the wiring substrate with respect to the other, and then vertically moving said one with respect to the other. Thereafter, whether positions of the semiconductor light emitting element of the donor substrate and the assembly groove of the wiring substrate corresponding to the semiconductor light emitting element overlap is inspected by a camera sensor or the like, and then, the semiconductor light emitting element is assembled to fit the assembly groove when the positions overlap.

Considering a subsequent process after the assembly, an error range of the semiconductor light emitting element assembled in the assembly groove should be within a few micrometers.

In addition, in the assembling operation (S1030), for example, hexa methyl di silazane (HDMS) coating or a self-assembled monolayer (SAM) treatment of attaching a functional group such as fluorocarbon is performed on a surface of the semiconductor light emitting element before the assembly.

The HDMS or the SAM treatment makes the surface of the semiconductor light emitting element hydrophobic. In general, the adhesive layer is made of organic components to have hydrophobicity. Thus, the treatment increases adhesion between the semiconductor light emitting element and the adhesive layer.

Finally, the reflow process is performed on the wiring substrate including the assembled LED (or the semiconductor light emitting element) (S1040).

For example, the reflow process is a process of placing the substrate assembled with the semiconductor light emitting element in a high-temperature chamber, and adjusting a temperature profile based on a time and an atmospheric gas in the chamber to stably bond the semiconductor light emitting element and the substrate to each other.

In addition, the reflow process may be performed in a temperature range from about 50 to 250 degrees in a hot-plate or an oven.

Through the reflow process, even when not being assembled at the correct position of the assembly groove, the semiconductor light emitting element positioned on the adhesive layer of the assembly groove is seated at the correct position of the assembly groove, that is, on a bottom surface of the assembly groove by the thermal flow characteristic of the adhesive layer.

Additionally, the semiconductor light emitting element assembled at the precise position of the assembly groove may be completely fixed at the corresponding position by performing UV (Ultra-Violet) curing or thermal curing on the adhesive layer after the reflow process, which is also an additional technical effect of the present disclosure.

FIGS. 11A to 11E are cross-sectional views illustrating a method for growing a semiconductor light emitting element of the present disclosure on a growing substrate.

Figure 11A:
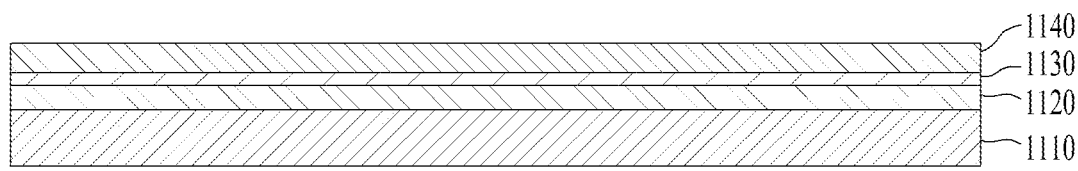
FIGS. 11A to 11E are cross-sectional views illustrating a method for growing a semiconductor light emitting element of the present disclosure on a growing substrate.

As shown in FIG. 11A, a second conductivity type semiconductor layer 1120, an active layer 1130, and a first conductivity type semiconductor layer 1140 are sequentially grown on a growing substrate 1110. The growing substrate 1110 may be formed to contain a material having a light-transmitting property, for example, one of sapphire (Al2O3), GaN, ZnO, and AlO.

In addition, the growing substrate 1110 may be formed of a material suitable for semiconductor material growth, a carrier wafer. The growing substrate 1110 may be formed of a material having excellent thermal conductivity. Including a conductive substrate or an insulating substrate, for example, a SiC substrate having higher thermal conductivity compared to a sapphire (Al2O3) substrate or at least one of Si, GaAs, GaP, InP, and Ga2O3 may be used for the growing substrate 1110, but the present disclosure may not be limited thereto.

Further, the second conductivity type semiconductor layer 1120 grown on the growing substrate 1110, which is an n-type semiconductor layer, may be a nitride semiconductor layer such as n-GaN, and the first conductivity type semiconductor layer 1140 may be a p-type semiconductor layer. However, the present disclosure is not necessarily limited thereto. The first conductivity type may be the n-type and the second conductivity type may be p-type.

Further, according to another embodiment of the present disclosure, the first conductivity type semiconductor layer 1140 and the second conductivity type semiconductor layer 1120 may be formed by implanting impurities into an intrinsic or doped semiconductor substrate. In addition, a region in which a p-n junction is formed by the impurity implantation may serve as the active layer 1130. The list detail of the first conductivity type semiconductor layer 1140, the second conductivity type semiconductor layer 1120, and the active layer 1130 are exemplary only, and the present disclosure is not limited thereto.

Figure 11B:
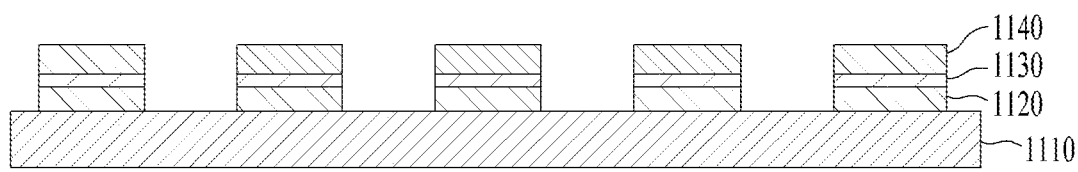

As shown in FIG. 11B, the first conductivity type semiconductor layer 1140, the active layer 1130, and the second conductivity type semiconductor layer 1120 grown on the growing substrate 1110 form a plurality of semiconductor light emitting elements isolated from each other through an etching process.

For example, the plurality of semiconductor light emitting elements isolated from each other are formed on the substrate by etching at least a portion of the first conductivity type semiconductor layer 1140, the active layer 1130, and the second conductivity type semiconductor layer 1120. In this case, the etching may be performed until the growing substrate 1110 is exposed.

As another example, the etching may be performed to a state in which a portion of the second conductivity type semiconductor layer 1120 is left between the semiconductor light emitting elements.

For the etching, dry etching of performing anisotropic etching using a plasma or a reactive ion gas or wet etching method of performing isotropic etching using chemicals may be used.

Figure 11C:
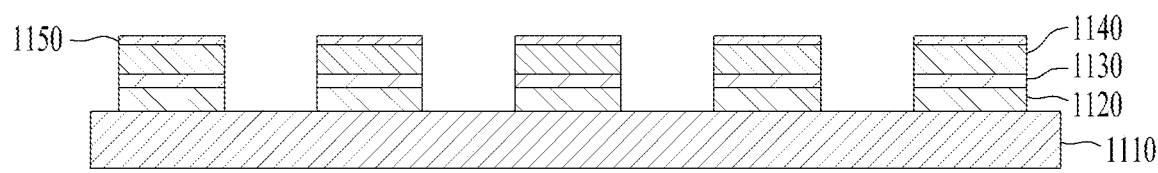

As shown in FIG. 11C, a first conductivity type electrode 1150 is formed on top of each of the plurality of isolated semiconductor light emitting elements. More specifically, the first conductivity type electrode 1150 may be formed of a conductive electrode and a buffer electrode.

Specifically, the first conductivity type electrode 1150 may form the conductive electrode on one surface of the first conductivity type semiconductor layer 1140, and sequentially form the buffer electrode on one surface of the conductive electrode.

For example, the conductive electrode may be in electrical contact with the first conductivity type semiconductor layer 1140 and may be formed of at least one metal layer. The conductive electrode may contain at least one of ITO, chromium (Cr), titanium (Ti), and nickel-silver (Ni—Ag) to form an ohmic contact layer having an ohmic contact characteristic with the first conductivity type semiconductor layer 1140.

In addition, the conductive electrode may further include an anti-oxidation layer containing at least one of gold (Au), silver (Ag), and platinum (Pt) to prevent oxidation of the first conductivity type electrode 1150. The listed detail of the conductive electrode is merely exemplary and the present disclosure is not limited thereto.

In one example, the buffer electrode, which is an electrode for improving adhesion between the conductive electrode and an insulating layer (passivation layer) to be described later, may contain at least one of titanium (Ti), chromium (Cr), and nickel (Ni). The listed detail of the buffer electrode is merely exemplary and the present disclosure is not limited thereto.

Figure 11D:
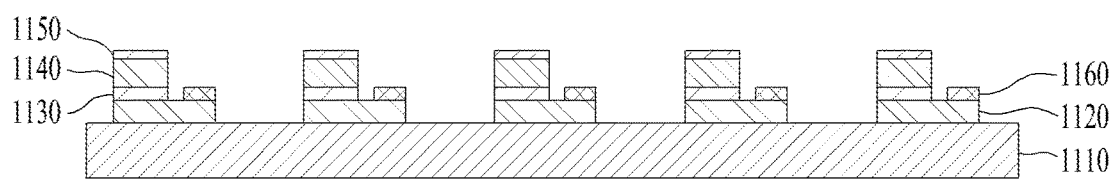

As shown in FIG. 11D, the second conductivity type electrode 1160 is formed on the second conductivity type semiconductor layer 1120. A process of patterning a partial region of the stacked semiconductor layer through a photo process, etching the corresponding region, and depositing a conductive electrode is performed.

The second conductivity type electrode 1160 may be formed of the conductive electrode and the buffer electrode like the first conductivity type electrode.

The conductive electrode may be in electrical contact with the second conductivity type semiconductor layer 1120 and may be formed of at least one metal layer. The conductive electrode may contain at least one of ITO, chromium (Cr), titanium (Ti), and nickel-silver (Ni—Ag) to form an ohmic contact layer having an ohmic contact characteristic with the second conductivity type semiconductor layer 1120.

In addition, the conductive electrode may further include an anti-oxidation layer containing at least one of gold (Au), silver (Ag), and platinum (Pt) to prevent oxidation of the second conductivity type electrode 1160. The listed detail of the conductive electrode is merely exemplary and the present disclosure is not limited thereto.

In one example, the buffer electrode, which is an electrode for improving adhesion between the conductive electrode and an insulating layer (passivation layer) to be described later, may contain at least one of titanium (Ti), chromium (Cr), and nickel (Ni). The listed detail of the buffer electrode is merely exemplary and the present disclosure is not limited thereto.

Figure 11E:
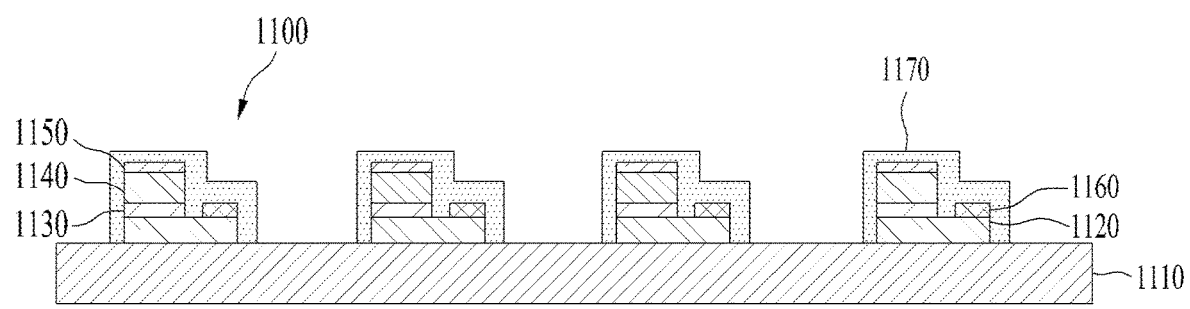

As shown in FIG. 11E, an insulating layer 1170 may be formed on the semiconductor light emitting element 1100 in which the first conductivity type electrode 1150 and the second conductivity type electrode 1160 are formed.

The insulating layer 1170 may have a shape surrounding at least one surface of the semiconductor light emitting element 1100. In addition, the insulating layer 1170 may have a shape surrounding a side surface of the isolated semiconductor light emitting element 1100.

The insulating layer 1170 may include a plurality of layers having different refractive indices to reflect light emitted from the side surface of the semiconductor light emitting element 1100. In addition, in the plurality of layers, a material having a relatively high refractive index and a material having a low refractive index may be repeatedly stacked.

Figure 12:
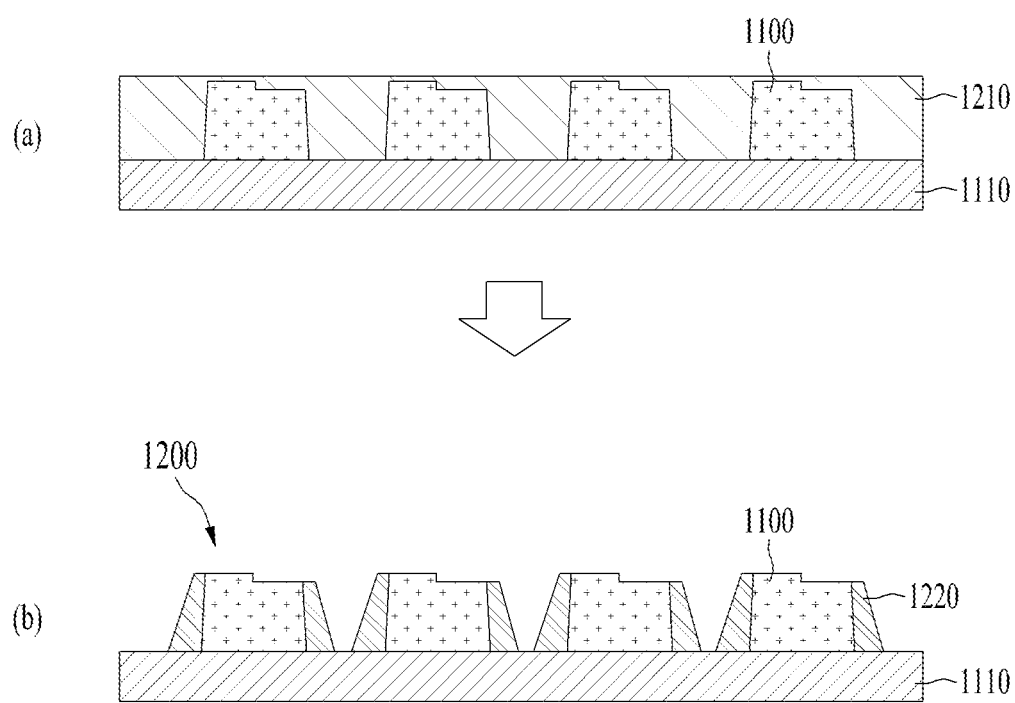
FIG. 12 shows cross-sectional views showing a process of forming a member having a thermal flow characteristic on a side surface of a semiconductor light emitting element of the present disclosure.

FIG. 12 shows cross-sectional views showing a process of forming a member having a thermal flow characteristic on a side surface of a semiconductor light emitting element of the present disclosure.

As shown in FIG. 12A, according to the sequence of FIG. 11, a material 1210 having the thermal flow characteristic is applied on the semiconductor light emitting element 1100 formed on the growing substrate 1110.

A component of the material 1210 may be a polymer-based component, and includes, for example, at least one of epoxy, acryl, silicone, polyimide (PI), and benzocyclobutene (BCB).

In addition, the component of the material 1210 may contain, for example, a binder and a monomer component allowing a material having no thermal flow characteristic to have the thermal flow characteristic.

In addition, viscosity of the material 1210 may be variously adjusted to be in the range from several centi-poises (cps) to several hundreds of cps. Although the thermal flow characteristic varies depending on the viscosity, the effect of the viscosity may be attenuated by adjusting the temperature and the time in the reflow process. Therefore, an embodiment of the present disclosure does not limit the viscosity of the material 1210 in a specific range.

In some cases, the material 1210 may be an inorganic material such as silicone nitride (SiNx) or ITO (Indium Tin Oxide).

As shown in FIG. 12B, a photo process and an etching process for forming a member 1220 made of the material are performed on at least one side surface, preferably on both side surfaces, of the semiconductor light emitting element.

In addition, the member may be primary cured by the UV (Ultra-Violet) curing or the thermal curing. Accordingly, in the operation of separating the semiconductor light emitting element from the growing substrate, the member is separated from the growing substrate together with the semiconductor light emitting element.

FIG. 12B shows a semiconductor light emitting element package 1200 in which the member 1220 is formed on the both side surfaces after the etching process.

A height or a width of the member 1220 shown in FIG. 12 are determined in consideration of the assembly groove of the substrate.

For example, when a width of the semiconductor light emitting element 1100 is 50 µm, and a width of the assembly groove of the substrate is 55 µm, a width of the member 1220 formed on the both side surfaces of the semiconductor light emitting element 1100 is about 1 to 2 µm.

Accordingly, the shape of the member 1220 shown in FIG. 12 is only an example, and the present disclosure is not limited thereto.

In addition, as will be described later, the member 1220 serves as a guide such that the semiconductor light emitting element may be accurately assembled into the assembly groove in the reflow process.

In addition, in the present disclosure, the process of forming the member 1220 of FIG. 12B after applying the material 1210 having the thermal flow characteristic as shown in FIG. 12A is shown, but the photo and etching processes for forming the member 1220 of FIG. 12B may be omitted when the semiconductor light emitting element 1100 is separated from the growing substrate using the laser lift-off (LLO).

That is, through the laser lift-off (LLO), a region of the semiconductor light emitting element separated from the growing substrate is determined. The region generally includes a periphery of the semiconductor light emitting element. Therefore, when the semiconductor light emitting element and the periphery thereof may be separated from the growing substrate together, and when the material having the thermal flow characteristic is formed at the periphery of the semiconductor light emitting element, the material may be naturally separated from the semiconductor light emitting element without the separate photo and etching processes.

Figure 13:
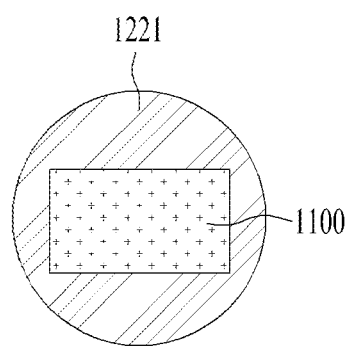
FIG. 13 shows plan views illustrating a shape of a semiconductor light emitting element in which a member of FIG. 12 is formed when viewed from above.
Figure 13:
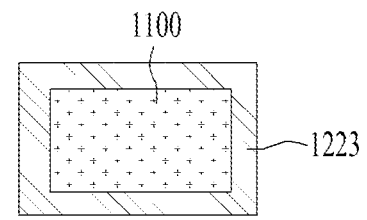

FIG. 13 shows plan views illustrating a shape of a semiconductor light emitting element in which a member of FIG. 12 is formed when viewed from above.

FIG. 13A shows a shape in which a member 1221 surrounds the semiconductor light emitting element 1100 in a circular shape.

Although the semiconductor light emitting device 1100 is shown in a rectangular shape, the semiconductor light emitting device 1100 may be formed in various shapes such as a circle, a polygon, and the like.

FIG. 13B shows a shape in which a member 1223 surrounds the semiconductor light emitting element 1100 in a rectangular shape.

Although the shape of the member is illustrated as the circular shape and the rectangular shape in FIG. 13, the listed detail of the member is merely exemplary and the present disclosure is not limited thereto.

Figure 14A:
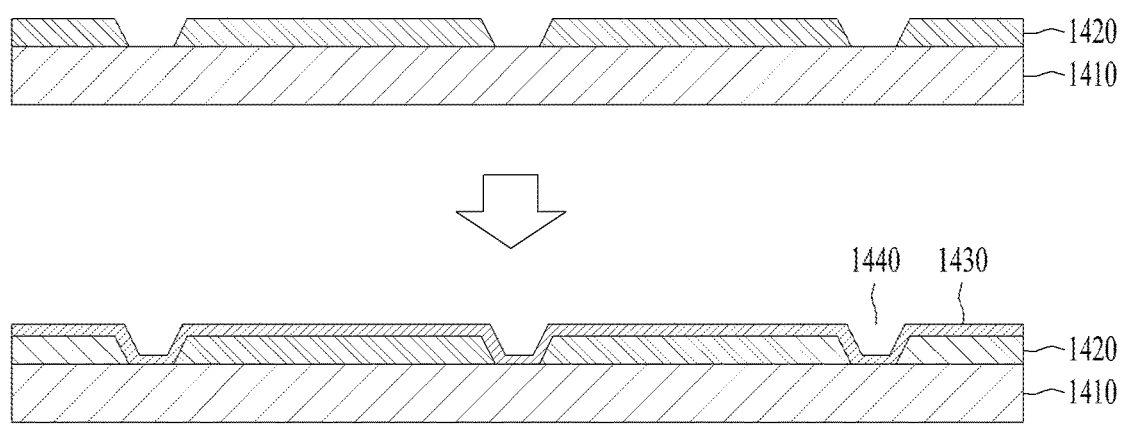
FIG. 14A shows cross-sectional views showing a method for manufacturing a substrate on which an assembly groove and an adhesive layer of the present disclosure are formed.

FIG. 14A shows cross-sectional views showing a method for manufacturing a substrate on which an assembly groove and an adhesive layer of the present disclosure are formed.

As shown in FIG. 14A, an assembly groove is defined to correspond to the shape of the semiconductor light emitting element to be assembled. The assembly groove may be defined through the photo process and the etching process after forming an insulating layer 1420 on a substrate 1410.

The assembly groove is, for example, a region in which the individual semiconductor light emitting element is assembled, and is a region defining a sub-pixel in the display device.

A component of the insulating layer 1420 may be, for example, a nitride-based insulating layer (SiNx) or a silicone (SiO2)-based material. In addition, a width of the assembly groove may be within a range from several μm to 2 mm, and a depth thereof may be within a range from several hundred nm to 100 μm.

The depth of the assembly groove should be equal to or smaller than a height of the semiconductor light emitting element 1100 in FIG. 12B when the semiconductor light emitting element 1100 is assembled on the wiring substrate by, for example, the stamp process. This is because when the assembly groove of the wiring substrate is too deep, the semiconductor light emitting element is not smoothly assembled onto the wiring substrate as the stamp process, which is the substrate-to-substrate transfer, has a structure in which the semiconductor light emitting element disposed to protrude from a specific substrate is engaged with the assembly groove of the wiring substrate.

In addition, the assembly groove has an opening and a bottom surface, and an area of the opening is larger than an area of the bottom surface.

By defining the opening to be wider than the bottom surface, for example, the assembly groove may have a constant inclination at a side surface thereof. Therefore, a semiconductor light emitting element that is incorrectly positioned on the side surface of the assembly groove during the assembly process moves along the inclination of the side surface of the assembly groove to the bottom surface of the assembly groove through the reflow process.

In addition, it was identified experimentally that, when the area of the opening has a large value in a range from about 1.5 to about 3 times the area of the bottom surface, the semiconductor light emitting element tends to move to the bottom surface of the assembly groove during the reflow process.

In addition, a metal reflective film may be formed at the lower portion of the assembly groove. The metal reflective film may include a plurality of layers having different refractive indices so as to reflect light emitted from a lower portion of the semiconductor light emitting element. In addition, in the plurality of layers, a material having a relatively high refractive index and a material having a low refractive index may be repeatedly stacked.

After defining the assembly groove, an adhesive layer 1430 is applied on top of the substrate. The assembly groove 1440 to which the adhesive layer 1430 is applied finally becomes the region in which the semiconductor light emitting element is assembled.

When a thickness of the adhesive layer 1430 is larger than a thickness of the insulating layer 1420, the inclined surface of the assembly groove may be changed to be flat. Thus, the thickness of the adhesive layer 1430 should be smaller than the thickness of the insulating layer 1420. Accordingly, the thickness of the adhesive layer 1430 may be flexibly changed based on the thickness of the insulating layer 1420 such that the inclined surface of the assembly groove is exposed.

Figure 14B:
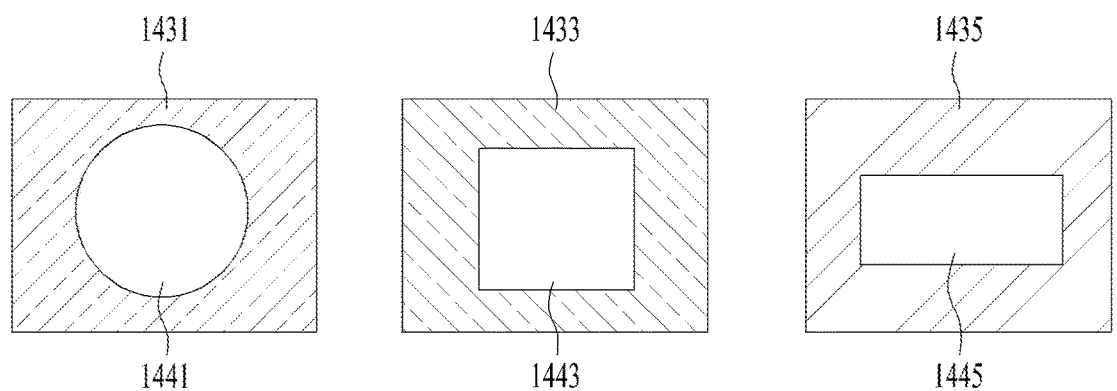
FIG. 14B shows plan views of a substrate manufactured by FIG. 14A observed from above.

FIG. 14B shows plan views of a substrate manufactured by FIG. 14A observed from above.

The assembly groove may be defined in various shapes. FIG. 14B shows various assembly grooves 1441, 1443, and 1445 and flat adhesive layer regions 1431, 1433, and 1435 that are defined and formed by forming the adhesive layer on the substrate and then performing the etching.

The assembly groove has been listed in a shape of a circular assembly groove 1441, a square assembly groove 1443, and a rectangular assembly groove 1445, but the present disclosure is not limited thereto.

Figure 15A:
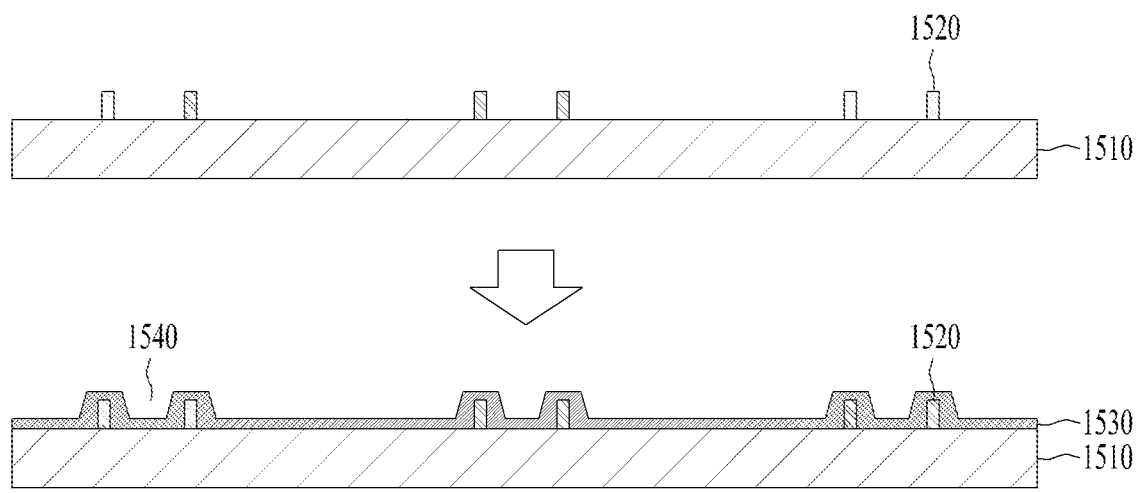
FIG. 15A shows cross-sectional views illustrating a process for manufacturing a substrate on which an assembly groove and an adhesive layer of the present disclosure are formed using a method different from that in FIG. 14A.

FIG. 15A shows cross-sectional views illustrating a process for manufacturing a substrate on which an assembly groove and an adhesive layer of the present disclosure are formed using a method different from that in FIG. 14A.

As shown in FIG. 15A, in order to define the assembly groove to correspond to the shape of the semiconductor light emitting element to be assembled, the assembly groove may be defined by partially forming partition walls 1520 on a substrate 1510, and then applying an adhesive layer 1530.

A component of the partition wall 1520 may be, for example, a nitride-based insulating film (SiNx) or a silicone (SiO2)-based material. In addition, a width of the assembly groove defined by the partition wall may be in a range from several μm to 2 mm, and a depth thereof may be in a range from several hundred nm to 100 μm.

An assembly groove 1540 by the partition walls 1520 may be designed to have the same structure as the assembly groove shown in FIG. 14, and the metal reflective film may be disposed at the lower portion of the assembly groove to increase a luminous efficiency of the semiconductor light emitting element.

Figure 15B:
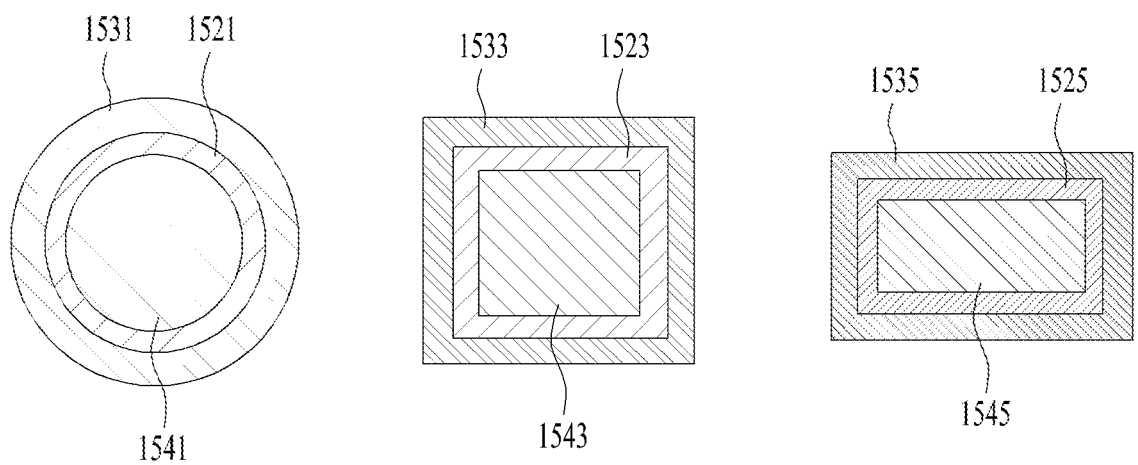
FIG. 15B shows plan views of a substrate manufactured by FIG. 15A observed from above.

FIG. 15B shows plan views of a substrate manufactured by FIG. 15A observed from above.

The assembly groove may be defined in various shapes. FIG. 15B shows regions 1521, 1523, and 1525 in which the adhesive layer is formed on top of the partition walls and protrudes, flat adhesive layer regions 1531, 1533, and 1535, and various assembly grooves 1541, 1543, and 1545 defined by the partition walls.

The assembly groove has been listed in a shape of a circular assembly groove 1541, a square assembly groove 1543, and a rectangular assembly groove 1545, but the present disclosure is not limited thereto.

Figure 16:
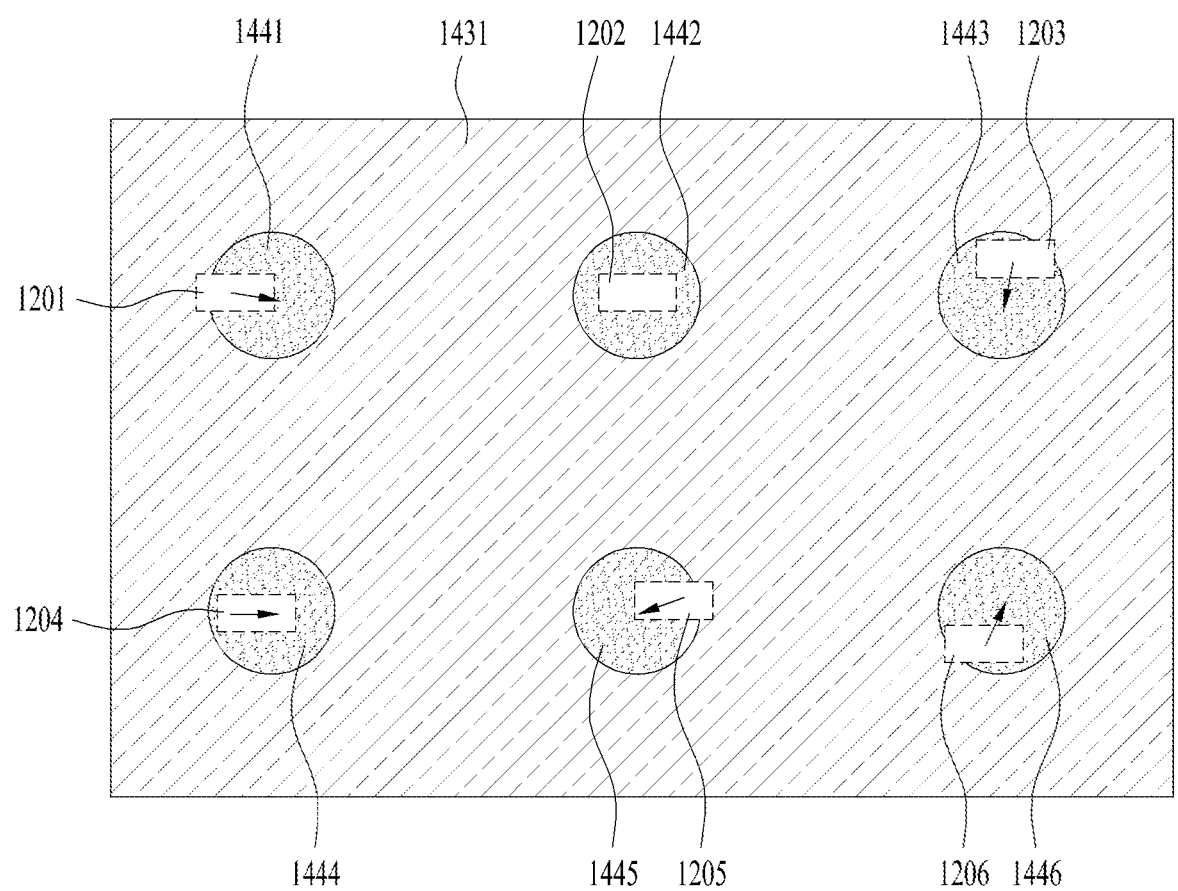
FIG. 16 is a view illustrating directions in which semiconductor light emitting elements move during a reflow process after assembling the semiconductor light emitting elements on a substrate.

FIG. 16 is a view illustrating directions in which semiconductor light emitting elements move during a reflow process after assembling the semiconductor light emitting elements on a substrate.

As shown in FIG. 12B, as the semiconductor light emitting element, a semiconductor light emitting element package in which a member having the thermal flow characteristics is formed on both side surfaces thereof will be described as an example.

As shown in FIG. 16, a semiconductor light emitting element package 1201 at a top left end is located at a left boundary of the assembly groove 1441 defined in the adhesive layer 1431. Therefore, during the reflow process, the semiconductor light emitting element package 1201 moves to the right along the inclined surface of the assembly groove 1441 toward the bottom surface of the assembly groove.

In addition, as shown in FIG. 16, in a case of a semiconductor light emitting element package 1202 located at a middle of the assembly groove 1442, there is no particular movement even when the reflow process is performed. This is because the semiconductor light emitting element package 1202 is already located on the bottom surface of the assembly groove.

On the other hand, as shown in FIG. 16, a semiconductor light emitting element package 1203 located at an upper boundary of the assembly groove 1443 moves downward toward the bottom surface of the assembly groove during the reflow process, and remaining semiconductor light emitting element packages 1204, 1205, and 1206 also move toward the bottom surface of the assembly grooves 1444, 1445, and 1446, respectively, according to the embodiments and the technologies of the present disclosure described above.

Figure 17:
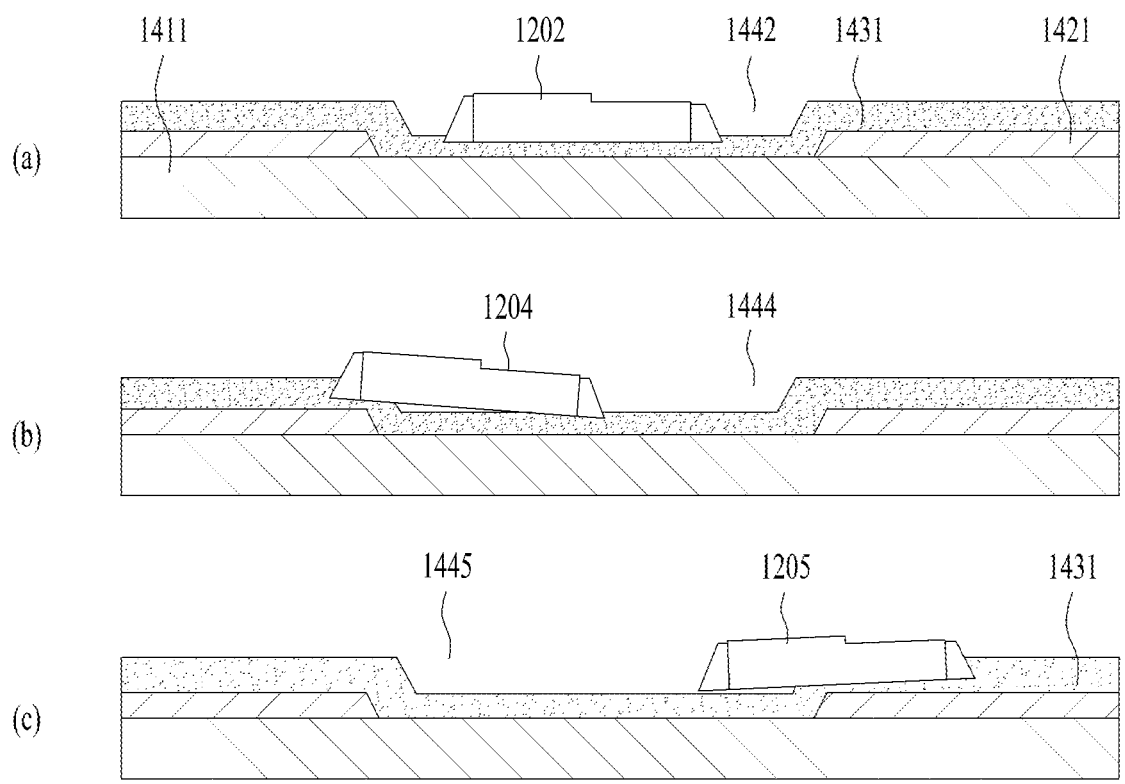
FIG. 17 shows cross-sectional views of some of semiconductor light emitting element packages shown in FIG. 16.

FIG. 17 shows cross-sectional views of some of semiconductor light emitting element packages shown in FIG. 16.

In order for the semiconductor light emitting element package to move to the bottom surface of the assembly groove in the reflow process, for example, the semiconductor light emitting element package should be positioned at an inclined portion of the assembly groove or at an interface of the assembly groove.

FIG. 17A is a diagram showing the semiconductor light emitting element package 1202 located precisely on the bottom surface of the assembly groove 1442 after the assembly process after the assembly groove 1442 is defined by etching the substrate 1411 coated with the insulating layer 1421. In this case, even when the reflow process is performed, the location of the semiconductor light emitting element package 1202 will not change much.

In one example, as shown in FIG. 17B, in the case of the semiconductor light emitting element package 1204 located on an inclined surface of the assembly groove 1444, the semiconductor light emitting element package 1204 will move toward the bottom surface of the assembly groove 1444 when the reflow process is performed.

In addition, as shown in FIG. 17C, in the case of the semiconductor light emitting element package 1205 located at an interface between the assembly groove 1445 and the flat adhesive layer 1431, the semiconductor light emitting element package 1205 will move toward the bottom surface of the assembly groove 1445 when the reflow process is performed.

Figure 18:
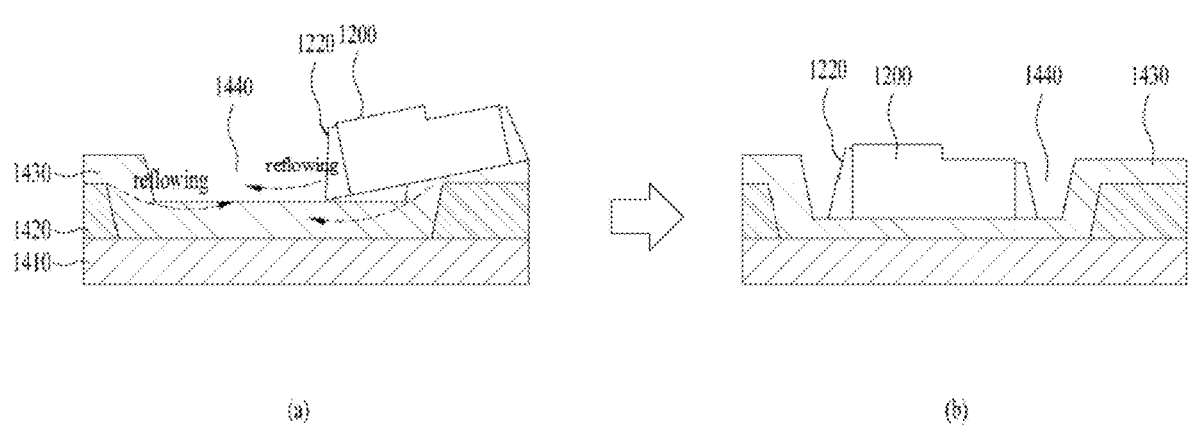
FIG. 18 is a diagram illustrating a principle in which a semiconductor light emitting element is self-aligned into an assembly groove through a reflow process.

FIG. 18 is a diagram illustrating a principle in which a semiconductor light emitting element is self-aligned into an assembly groove through a reflow process.

As the semiconductor light emitting element, the semiconductor light emitting element package 1200 in which the member having the thermal flow characteristics is formed on the both side surfaces thereof as shown in FIG. 12B will be described as an example.

FIG. 18A is an example of a case in which the semiconductor light emitting element package 1200 in which the member having the thermal flow characteristic is formed is located at the interface of the assembly groove 1440. Because of the heat applied during the reflow process, the member and the adhesive layer 1430 become to have a fluidic behavior characteristic to flow downward. Therefore, the semiconductor light emitting element package 1200 located at the interface is self-aligned while naturally moving to the bottom surface of the assembly groove 1440 under an influence of gravity by a weight of the semiconductor light emitting element itself.

In addition, components of the member and the adhesive layer having the thermal flow characteristic may be the same. As described above, the member has a technical effect of the present disclosure in that the member serves as a guide to help the semiconductor light emitting element be self-aligned into the assembly groove in the reflow process. Therefore, for example, when the components of the member and the adhesive layer are the same, a fluidic flow the same as that of the adhesive layer is generated in the member by the heat generated in the reflow process, so that the member may more easily serve as the guide that allows the semiconductor light emitting element to move to the bottom surface of the assembly groove.

FIG. 18B is a diagram illustrating the semiconductor light emitting element package 1200 that is self-aligned at a central location of the assembly groove 1440 after the reflow process.

FIG. 18B shows that the adhesive layer 1430 exists with a considerable thickness between the semiconductor light emitting element package 1200 located at the center of the assembly groove 1440 and the bottom surface of the assembly groove, but this is only an example. The thickness may vary based on the flow characteristic of the adhesive layer and the reflow process condition.

In addition, in FIG. 18, the semiconductor light emitting element package in which the member is formed on the both side surfaces of the semiconductor light emitting element has been described as an example. However, the member only serves as the guide for more easily performing the self-alignment. Even in the case of the semiconductor light emitting element in which the member is not formed, the semiconductor light emitting element may be assembled at the correct position of the assembly groove through the reflow process by the principle disclosed in FIG. 18.

Figure 19:
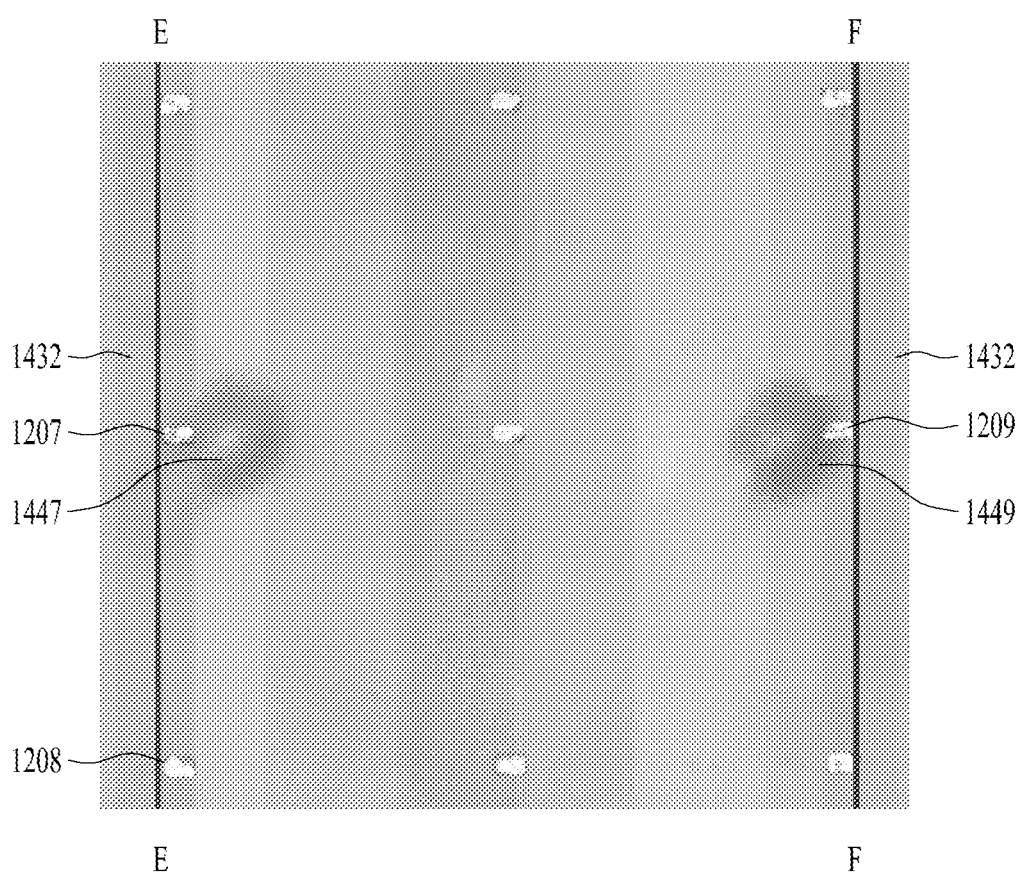
FIG. 19 is an image obtained by observing a shape of an actually manufactured semiconductor light emitting element package assembled on a substrate having an assembly groove with an optical microscope.

FIG. 19 is an image obtained by observing a shape of an actually manufactured semiconductor light emitting element package assembled on a substrate having an assembly groove with an optical microscope.

The semiconductor light emitting element package was originally located on the donor substrate, and then, assembled onto the substrate having the assembly groove defined therein from the donor substrate through the stamp process. Assembly grooves 1447 and 1449 were arbitrarily defined in two of central regions of the substrate to experimentally prove the effect of the present disclosure.

In addition, as shown in FIG. 19, three semiconductor light emitting element packages are arranged in a straight line on a vertical axis based on a line E-E and three semiconductor light emitting element packages are arranged in a straight line on a vertical axis based on a line F-F.

In addition, in order to experimentally prove the effect of the present disclosure, intentionally, the semiconductor light emitting element packages are not accurately assembled at the locations of the assembly grooves 1447 and 1449. Specifically, the semiconductor light emitting element packages 1207 and 1209 are located at interfaces of the assembly grooves 1447 and 1449, respectively.

On the other hand, for comparison with the semiconductor light emitting element package 1207, another semiconductor light emitting element package 1208 is placed on top of a flat adhesive layer 1432 without the assembly groove.

Figure 20:
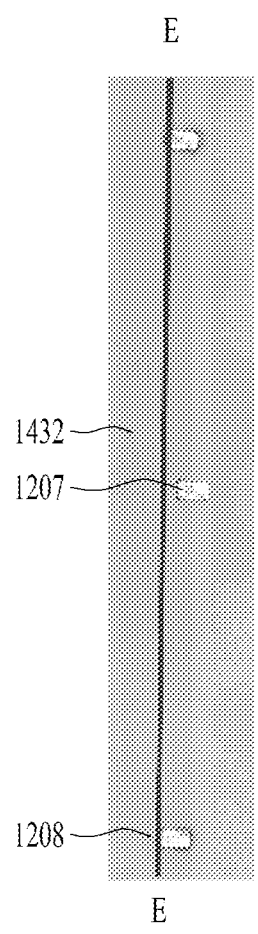
FIG. 20 is an image obtained by observing a degree of movement of a semiconductor light emitting element package in FIG. 19 after a reflow process with an optical microscope.
Figure 20:
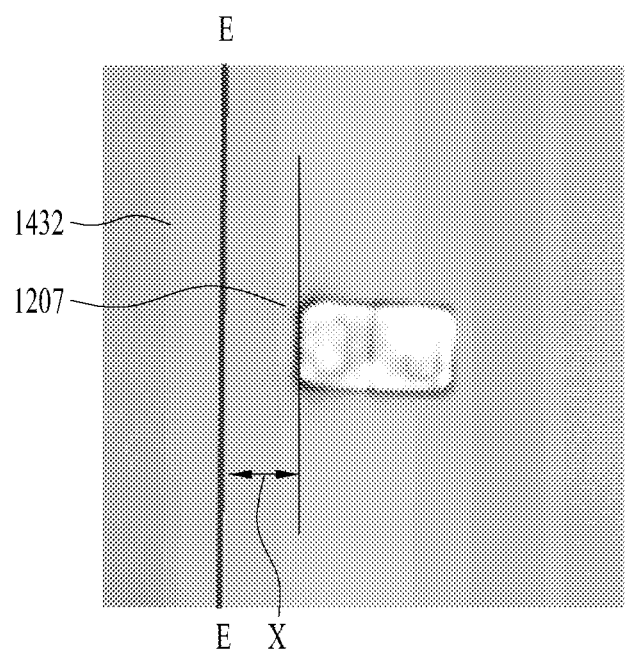

FIG. 20 is an image obtained by observing a degree of movement of a semiconductor light emitting element package in FIG. 19 after a reflow process with an optical microscope.

FIG. 20A is an optical image showing shapes of the three semiconductor light emitting element packages formed along the line E-E in FIG. 19 after the reflow process.

As shown in FIG. 20A, the semiconductor light emitting element package 1208 that was located on top of the flat adhesive layer 1432 in which the assembly groove does not exist in FIG. 19 does not show any traces of movement based on the line E-E even after the reflow process.

On the other hand, it may be seen that the semiconductor light emitting element package 1207, which was located at the interface of the assembly groove, moved slightly to the right with respect to the line E-E.

FIG. 20B is an enlarged optical image of FIG. 20A for observing a distance that the semiconductor light emitting element package 1207 has moved.

It was observed that the semiconductor light emitting element package 1207 has moved by X based on the line E-E after the reflow process. As a result of optical observation, X was identified to be about 10 μm.

That is, according to the present disclosure, even when the assembly error between the assembly groove and the semiconductor light emitting element in a range from several μm to 10 μm occurs, through the reflow process, the semiconductor light emitting element (or the semiconductor light emitting element package) is self-aligned at the correct position of the assembly groove, thereby minimizing the assembly error.

In general, when the assembly error between the semiconductor light emitting element and the assembly groove is large (when the semiconductor light emitting element is not correctly assembled into the assembly groove), a short between the electrodes is likely to occur in a planarization process and a wiring process afterwards, thereby reducing a yield of mass-produced products.

According to the prior art, in order to reduce the assembly error, the error has been avoided or overcome using an indirect method such as changing a design of the subsequent wiring process. However, such method has caused problems such as an increase in manufacturing cost.

On the other hand, in the present disclosure, the semiconductor light emitting element is self-aligned into the assembly groove using the adhesive layer having the thermal flow characteristic. Thus, the present disclosure minimizes the assembly error using an active and direct method.

In addition, in the application of the present disclosure, there is no restriction based on the size of the semiconductor light emitting element, and an expensive material is not required.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A method for manufacturing a display device, the method comprising:
   growing a plurality of light emitting diodes (LEDs) on a growing substrate;
   forming a member having a thermal flow characteristic on at least one side surface of each of the plurality of LEDs;
   separating each of the plurality of LEDs from the growing substrate;
   forming a plurality of assembly grooves in a wiring substrate for defining pixel regions;
   applying an adhesive layer on the plurality of assembly grooves and a periphery of each of the plurality of assembly grooves, wherein a component of the adhesive layer is same as a component of the member;
   assembling the plurality of LEDs at locations respectively corresponding to the plurality of assembly grooves; and
   applying heat to the wiring substrate which allows the member having the thermal flow characteristic to have a fluidic behavior characteristic such that the member flows downward for a reflow process which adjusts a position of at least one of the plurality of LEDs.

2. The method of claim 1, wherein the component of the adhesive layer has the thermal flow characteristic.

3. The method of claim 1, wherein the component of the adhesive layer includes at least one of epoxy, acryl, silicone, polyimide (PI), or benzocyclobutene (BCB).

4. The method of claim 1, wherein the adhesive layer contains a binder and a monomer component.

5. The method of claim 1, wherein each of the plurality of assembly grooves has an opening and a bottom surface, and
   wherein an area of the opening is greater than an area of the bottom surface for each of the plurality of assembly grooves.

6. The method of claim 1, wherein the forming the member includes curing the member by ultra-violet (UV) curing or thermal curing.

7. The method of claim 1, further comprising:
   disposing a metal reflective film at a lower portion of each of the plurality of assembly grooves in the wiring substrate.

8. The method of claim 1, wherein the assembling the plurality of LEDs at the locations respectively corresponding to the plurality of assembly grooves includes moving the plurality of LEDs by an electromagnetic field.

9. The method of claim 1, wherein the assembling the plurality of LEDs at the locations respectively corresponding to the plurality of assembly grooves includes:
   transferring the plurality of LEDs to a transfer substrate; and
   moving the plurality of LEDs from the transfer substrate into the locations respectively corresponding to the plurality of assembly grooves through a stamp process.

10. The method of claim 1, wherein each of the plurality of LEDs is a micro-LED having a micrometer size.

11. The method of claim 1, wherein the wiring substrate contains at least one of glass, a conductor, or a flexible polymer material.

12. A display device comprising:
    a substrate having an assembly groove;
    an adhesive layer covering the assembly groove and a periphery of the assembly groove;
    a light emitting diode (LED) assembled into the assembly groove; and
    a member disposed on at least one side of the LED, the member having a thermal flow characteristic,
    wherein the adhesive layer is disposed between the LED and the assembly groove, and
    wherein the assembly groove has an opening and a bottom surface of the assembly groove, and an area of the opening is greater than an area of the bottom surface of the assembly groove,
    wherein a position of the LED is adjusted by heating the substrate to allow the member having the thermal flow characteristic to have a fluidic behavior characteristic such that the member flows downward, and by curing the member, and
    wherein a component of the adhesive layer is same as a component of the member.

13. The display device of claim 12, wherein the component of the adhesive layer has the thermal flow characteristic.

14. The display device of claim 12, wherein the component of the adhesive layer includes at least one of epoxy, acryl, silicone, polyimide (PI), or benzocyclobutene (BCB).

15. The display device of claim 12, wherein the adhesive layer contains a binder and a monomer component.

16. The display device of claim 12, wherein a functional group that makes a surface of the LED hydrophobic is disposed on the surface of the LED.

17. The display device of claim 16, wherein the functional group includes at least one of hexa methyl di silazane (HDMS) or fluorocarbon.

* * * * *